(12) United States Patent
Xin et al.

(10) Patent No.: US 8,963,209 B2
(45) Date of Patent: *Feb. 24, 2015

(54) ENHANCEMENT-MODE HFET CIRCUIT ARRANGEMENT HAVING HIGH POWER AND A HIGH THRESHOLD VOLTAGE

(71) Applicant: Power Integrations, Inc., San Jose, CA (US)

(72) Inventors: Xiaobin Xin, Herndon, VA (US); Milan Pophristic, Princeton, NJ (US); Michael Shur, Latham, NY (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/758,574

(22) Filed: Feb. 4, 2013

(65) Prior Publication Data

US 2013/0146891 A1    Jun. 13, 2013

Related U.S. Application Data

(63) Continuation of application No. 12/819,446, filed on Jun. 21, 2010, now Pat. No. 8,368,121.

(51) Int. Cl.
| | | |
|---|---|---|
| *H01L 29/778* | (2006.01) | |
| *H01L 27/06* | (2006.01) | |
| *H01L 29/40* | (2006.01) | |
| *H01L 29/417* | (2006.01) | |
| *H01L 29/20* | (2006.01) | |
| *H01L 29/423* | (2006.01) | |
| *H03K 17/687* | (2006.01) | |

(52) U.S. Cl.
CPC ........ *H01L 27/0629* (2013.01); *H01L 27/0605* (2013.01); *H01L 29/402* (2013.01); *H01L 29/41725* (2013.01); *H01L 29/7787* (2013.01); *H01L 27/0617* (2013.01); *H01L 29/2003* (2013.01); *H01L 29/41758* (2013.01); *H01L 29/42316* (2013.01); *H01L 29/4236* (2013.01); *H03K 2017/6875* (2013.01)
USPC .......................................................... 257/195

(58) Field of Classification Search
USPC ......................................................... 257/195
See application file for complete search history.

(56) References Cited

U.S. PATENT DOCUMENTS 5,374,862 A * 12/1994 Takano .......................... 326/112
5,939,941 A    8/1999 Nair et al.
(Continued)

OTHER PUBLICATIONS

Wataru Saito, "Recessed-Gate Structure Approach Toward Normally Off High-Voltage AlGaN/GaN HEMT for Power Electronics Applications" IEEE Transactions on Electron Devices, vol. 53, No. 2, Feb. 2006, pp. 356-362.

*Primary Examiner* — Stephen W Smoot
(74) *Attorney, Agent, or Firm* — Stuart H. Mayer; Mayer & Williams PC

(57) ABSTRACT

A circuit includes input drain, source and gate nodes. The circuit also includes a group III nitride enhancement-mode HFET having a source, drain and gate and a voltage shifter having a first terminal connected to the gate of the enhancement mode HFET at a common junction. The circuit also includes a load resistive element connected to the common junction. The drain of the enhancement-mode HFET serves as the input drain node, the source of the enhancement-mode HFET serves as the input source node and a second terminal of the voltage shifter serves as the input gate node.

18 Claims, 14 Drawing Sheets

A HIGH $V_T$, HIGH POWER, HIGH VOLTAGE ENHANCEMENT DEVICE

DEVICE WITH A LEVEL SHIFT TRANSISTOR

(56) References Cited

U.S. PATENT DOCUMENTS

| | | | |
|---|---|---|---|
| 6,479,843 B2 | 11/2002 | Huang et al. | |
| 6,586,781 B2 | 7/2003 | Wu et al. | |
| 7,439,805 B1 | 10/2008 | Kobayashi | |
| 8,368,121 B2 * | 2/2013 | Xin et al. | 257/195 |
| 2007/0023779 A1 | 2/2007 | Hirose et al. | |
| 2007/0069306 A1 * | 3/2007 | Kapoor et al. | 257/369 |

* cited by examiner

DEVICE WITH A LEVEL SHIFT TRANSISTOR

DEVICE WITH THREE LEVEL SHIFT DIODES

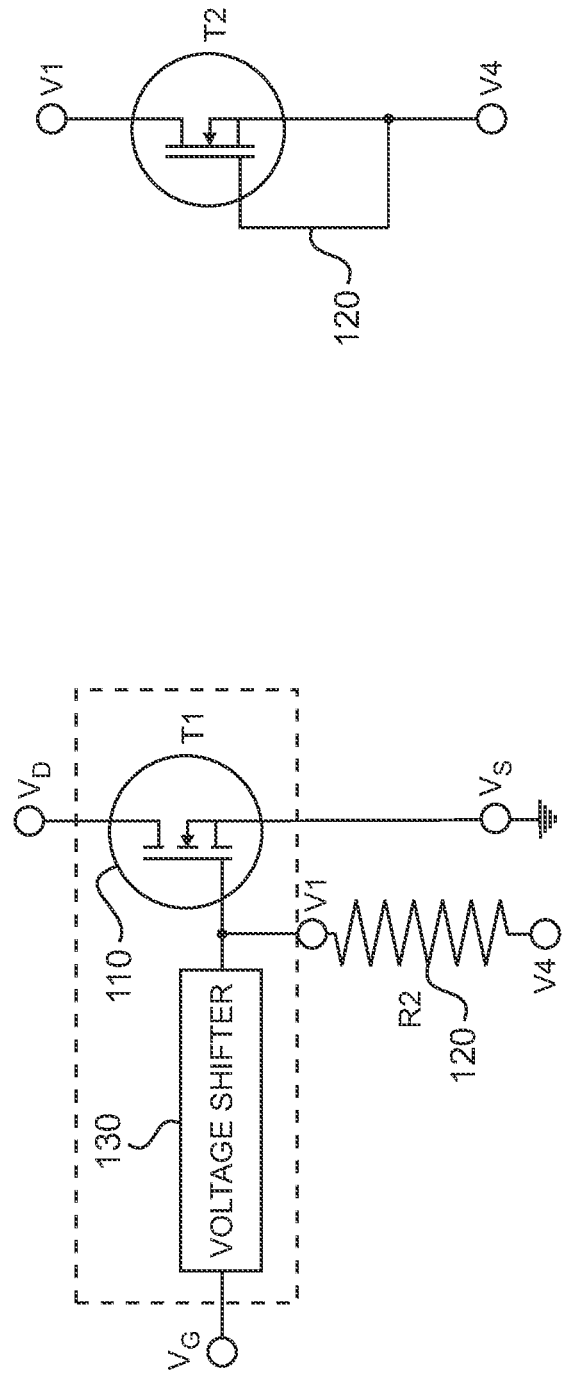

CROSS-SECTIONAL VIEW OF DEPLETION MODE DEVICE WITH PASSIVATION AND GATE DIELECTRIC.

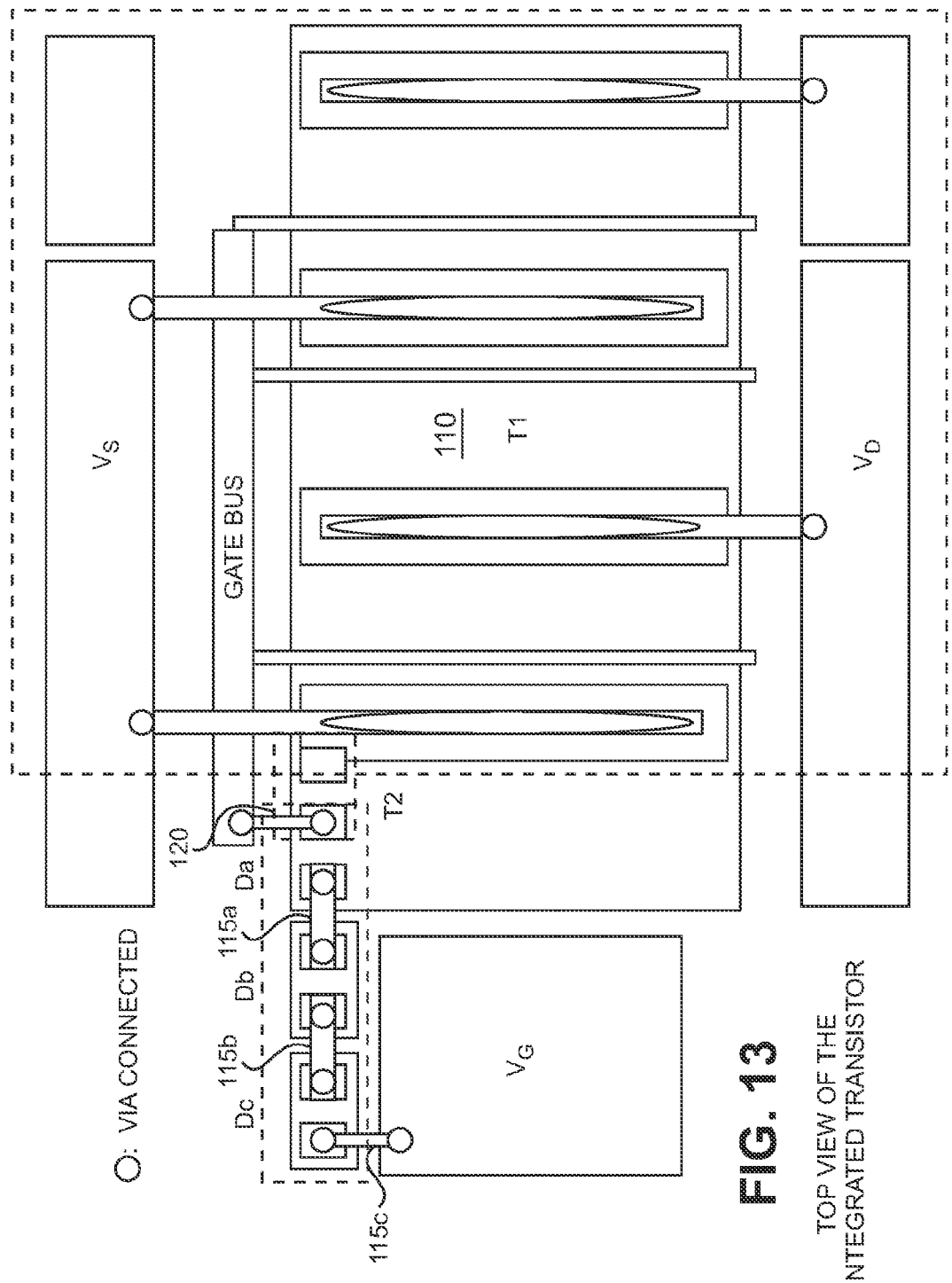

SIMULATION (a)

SIMULATION RESULTS FOR THE STRUCTURE IN FIG. 2

SIMULATION RESULTS

ENHANCEMENT-MODE HFET CIRCUIT ARRANGEMENT HAVING HIGH POWER AND A HIGH THRESHOLD VOLTAGE

STATEMENT OF RELATED APPLICATION

This application is a continuation of U.S. patent application Ser. No. 12/819,446, filed Jun. 21, 2010, entitled "AN ENHANCEMENT-MODE HFET CIRCUIT ARRANGEMENT HAVING HIGH POWER AND A HIGH THRESHOLD VOLTAGE", now U.S. Pat. No. 8,368,121 issued Feb. 5, 2013, which is incorporated herein by reference in its entirety.

FIELD OF THE INVENTION

The present invention relates generally to a Group III nitride compound semiconductor HFET such as a GaN-based HFET, and more particularly to a circuit that employs a GaN-based HFET having a low threshold voltage and which functions as a GaN-based HFET having a higher threshold voltage, a high on-state current and high speed.

BACKGROUND OF THE INVENTION

GaN-based Heterojunction Field Effect Transistors (HFETs) using a wide bandgap semiconductor such as GaN, AlGaN, InGaN, AlGaN, InAlN, AlInGaN and the like have received much attention as a power device for high power application since they are one order of magnitude or more smaller in on-resistance than transistors using Si or GaAs, are capable of operating at higher temperature with high current and can withstand high voltage applications.

One example of a conventional GaN-based HFET is shown in FIG. 1. IN FIG. 1, as well as the figures that follow, like reference numerals are used to denote like elements. As shown, a heterojunction structure is formed on a substrate such as a sapphire, silicon, or diamond substrate 91. The heterojunction structure includes a nucleation layer 92 of GaN, for example, a semi-insulating undoped GaN layer 93, and an undoped AlGaN layer 94, which is generally much thinner than the undoped GaN layer 93. The two-dimensional (2-D) electron gas channel 79 is located adjacent to the interface of layers 93 and 94. An optional layer of GaN a few atomic layers thick may optionally be formed on top of AlGaN layer 94, which is not shown in FIG. 1 or the figures that follow. The optional GaN layer may improve the ohmic contact and often is removed naturally after ohmic annealing and chemical treatment. Two n-AlGaN/GaN contact layers 95 are disposed on the undoped AlGaN layer 94 and annealed to form ohmic contact with the 2-D gas. A source electrode S and a drain electrode D are arranged on their respective contact layers 95. A gate electrode G is formed onto the undoped AlGaN layer 94 and is situated between the source electrode S and the drain electrode D.

The GaN-based HFET device is capable of maximizing electron mobility by forming a quantum well at the heterojunction interface between the AlGaN layer, which has a larger band gap, and the GaN layer, which has a narrower band gap. As a result, electrons are trapped in the quantum well. The trapped electrons are represented by a two-dimensional electron gas 79 in the undoped GaN layer. The amount of current is controlled by applying voltage to the gate electrode, which is in Schottky contact with the semiconductors so that electrons flow along the channel between the source electrode and the drain electrode.

Even when the gate voltage is zero, electrons will be present in the channel because a piezoelectric field is formed that extends from the substrate toward the device surface. Consequently, the GaN-based HFET acts as a depletion-mode (i.e., normally-on) device. For a variety of reasons it would be desirable to provide an enhancement mode (i.e., normally-off) GaN-based HFET. For example, when a depletion-mode HFET is employed as a switching device for a power source, it is necessary to continuously apply a bias voltage to the gate electrode that is lower than the threshold value to keep the switch in the off state. Such an arrangement often results in a more complicated circuit and requires more voltage levels such as negative voltages. On the other hand, if an enhancement mode HFET is employed, the switch can be maintained in the off state even a gate voltage of zero using a simplified circuit. Attempts have been made to manufacture GaN-based enhancement-mode HFETs by depleting or eliminating the two-dimensional gas in the gate area. Unfortunately, such attempts have generally not been satisfactory when pursuing a high positive threshold voltage because of problems such as poor on-state currents, poor breakdown voltages and lower operational speeds due to the resistance and capacitance in the gate regions as well as damage that is caused to the gate regions during fabrication. Therefore, there is an inherent trade-off between a high threshold voltage and a high on-state current/speed.

SUMMARY

In accordance with the present invention, a circuit is provided which includes input drain, source and gate nodes. The circuit also includes a group III nitride enhancement-mode HFET having a source, drain and gate and a voltage shifter having a first terminal connected to the gate of the enhancement mode HFET at a common junction. The circuit also includes a load resistive element connected to the common junction. The drain of the enhancement-mode HFET serves as the input drain node, the source of the enhancement-mode HFET serves as the input source node and a second terminal of the voltage shifter serves as the input gate node.

In accordance with another aspect of the invention, an enhancement-mode HFET circuit is provided which includes input drain, source and gate nodes. The HFET also includes a group III nitride depletion-mode HFET having a source, drain and gate and a voltage shifter having a first terminal connected to the gate of the depletion-mode HFET at a common junction. The HFET also includes a load resistive element having a first terminal connected to the common junction. The drain of the depletion-mode HFET serves as the input drain node, the source of the depletion-mode HFET serves as the input source node, a second terminal of the voltage shifter serves as the input gate node and a second terminal of the load resistive element serves as a fourth input node.

In accordance with yet another aspect of the invention, a method is provided for forming an enhancement-mode HFET circuit having a high threshold voltage. The method includes providing an enhancement-mode HFET having a first threshold voltage that is less than a desired threshold voltage. A voltage shifter and a load resistive element are also provided. A first terminal of the voltage shifter and a first terminal of the load resistive element are coupled to a gate of the enhancement-mode HFET such that a second threshold voltage applied to a second terminal of the voltage shifter is equal to the desired threshold voltage.

BRIEF DESCRIPTION OF THE DRAWINGS

FIGS. 5a and 5b show two examples of a four terminal HFET arrangement constructed in accordance with the principles of the present invention.

FIG. 11a shows one way in which a resistor may be monolithically integrated with the transistors in an HFET circuit arrangement.

FIG. 11b shows one example of an HFET circuit arrangement incorporating the resistor shown in FIG. 11a.

FIG. 13 shows a plan view of the monolithically integrated HFET shown in FIG. 12.

DETAILED DESCRIPTION

The present inventors have recognized that a GaN-based enhancement mode HFET arrangement having a high on-state current, high operating voltage, high switching speed as well as a high threshold voltage can be produced from a GaN-based enhancement mode HFET arrangement having high on-state current, high operating voltage and a low threshold voltage. As detailed below, this can be accomplished by combining such a GaN-based enhancement mode HFET with other components such as voltage shifter and a load resistor.

Figure 1:
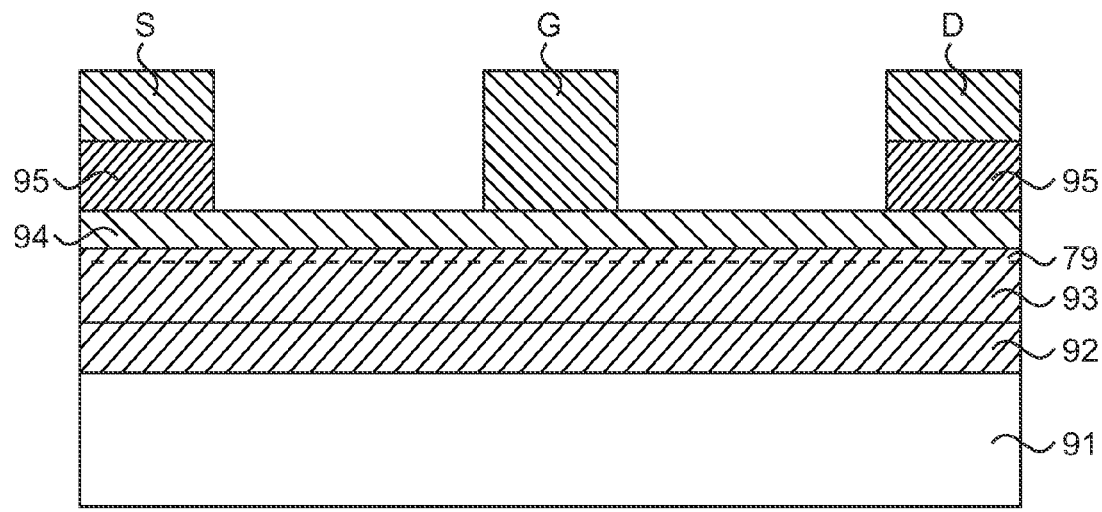
FIG. 1 shows an example of a conventional GaN-based HFET.
Figure 2:
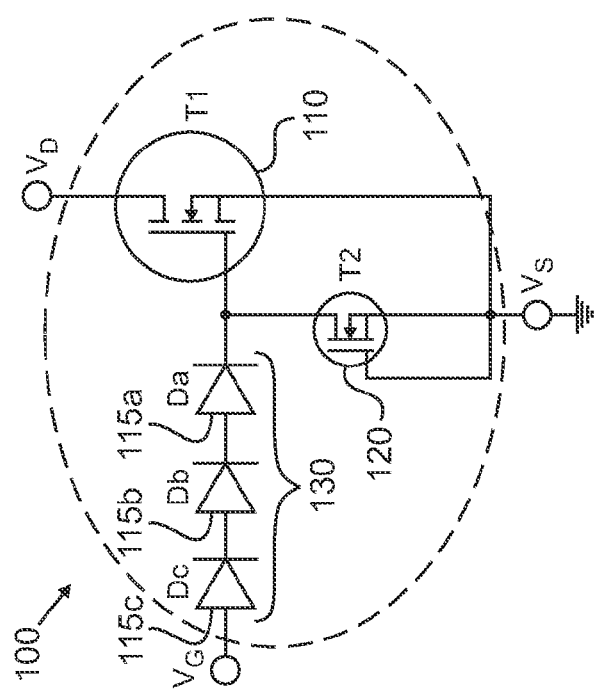
FIG. 2 shows a first example of a HFET circuit arrangement 100 constructed in accordance with the principles of the present invention.

FIG. 2 shows a first example of a HFET circuit arrangement 100 constructed in accordance with the principles of the present invention. The HFET arrangement 100 includes an enhancement mode HFET 110 having the aforementioned characteristics (i.e., high on-state current, high operating voltage and a low threshold voltage, such as a threshold voltage between about 0.1V to 1.0V, for instance). Such a HFET 110 can be readily manufactured in accordance with known techniques. The HFET arrangement 100 also includes one or more serially connected diodes 115 that collectively constitute a voltage shifter 130. In this example the voltage shifter 130 includes three diodes 115a, 115b and 115c. The level shifting diodes 115a, 115b and 115c are connected to the gate of the HFET 110. A load resistive element 120 is connected to the common junction of the gate of the HFET 110 and the voltage shifter 130. The load resistive element 120 forms a voltage divider with the voltage shifter 130 to regulate the gate voltage of the HFET 110 and to release stored charges when the HFET 110 is switched off. The load resistive element 120 may be formed from a resistor, for example, or another suitable element such as the depletion mode load HFET shown in FIG. 1. As shown, the load HFET 120 has its gate and source shorted to ground.

The use of the voltage shifter 130 advantageously separates the function of shifting the threshold voltage from the function of providing a high on-state current. In other words, one component, the voltage shifter 130, serves to provide the high threshold voltage, while another component, the HFET 110, serves to provide the high on-state current. The choice of a low threshold voltage for the HFET 110 ensures its high current capability. Thus, the use of the level shifting diodes 115 moves the threshold voltage to any desired higher value without deteriorating its high current capability. A relatively low resistance value is desirable for the load resistive element 120 to achieve high switching speeds. The exact resistive value that is used will depend on speed requirements, the input capacitance of the HFET 110 and the capacitance of the voltage shifter 130.

Figures 3A, 3B:
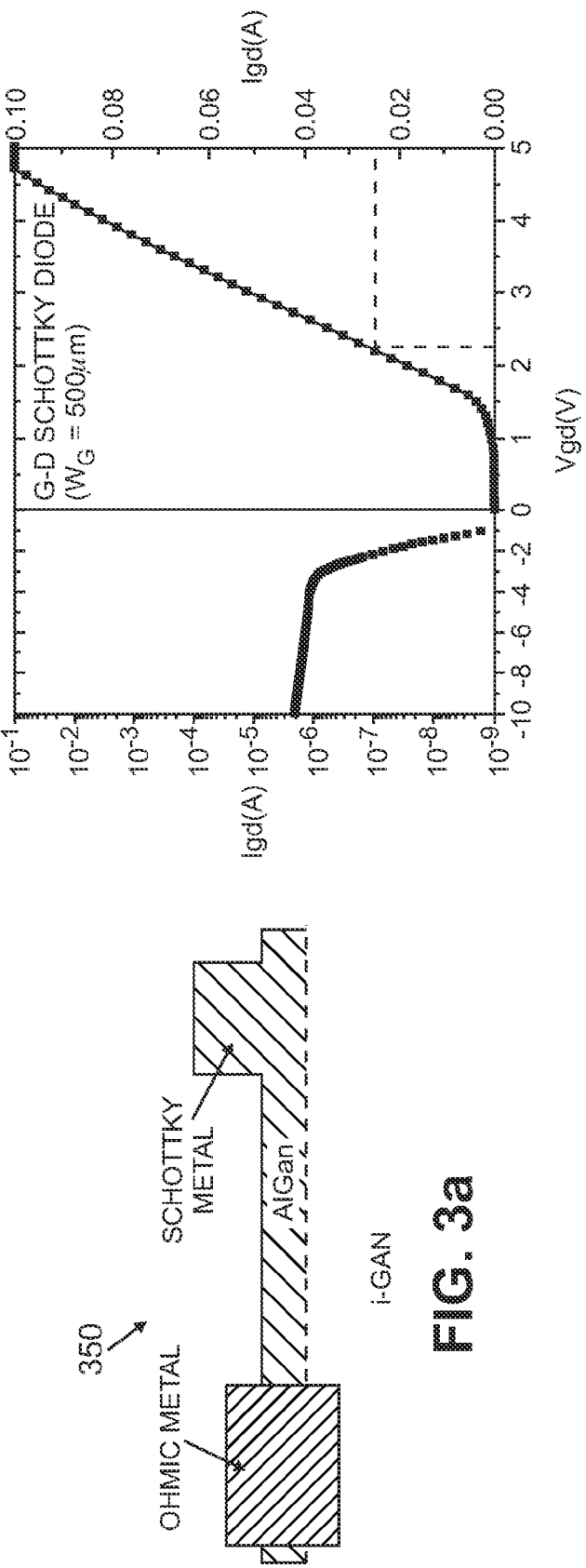
FIG. 3a shows the cross-sectional view of an illustrative Schottky diode and FIG. 3b is a graph of the current-voltage characteristics of such a level shift diode.

As an example, each of the level shift diodes may employ a high work-function metal on AlGaN such as Ni, which forms a Schottky diode with a forward voltage drop of 1.5V. If HFET 110 has a threshold voltage of 0.5V, for example, and two or three level shift diodes are used, the threshold voltage can be shifted to a value of 3.5V or 5.0V. FIG. 3a shows the cross-sectional view of an illustrative Schottky diode 350 and FIG. 3b is a graph of the current-voltage characteristics of such a level shift diode. Since it is a unipolar device, the capacitance of a Schottky diode is small. If a load HFET 120 is employed, the level shift diodes should provide a finite driver current to generate a finite voltage drop across the load HFET 120 and all of the driver current needs to be provided by an external circuit. Such a forward current also implies a forward voltage drop higher than the build-in voltage of the diodes. For example, if the load resistance is 2 kΩ, the HFET 110 has a threshold voltage of 0.5V and the diode has a build-in voltage of 1.5V, to generate a voltage 0.5V, the diode forward current and voltage needs to be 25 mA and 2.25V, respectively. Thus, two diodes will generate a 4.5V forward voltage drop and the total threshold voltage $V_T$ will be 4.5V+0.5V=5.0V.

Figure 4:
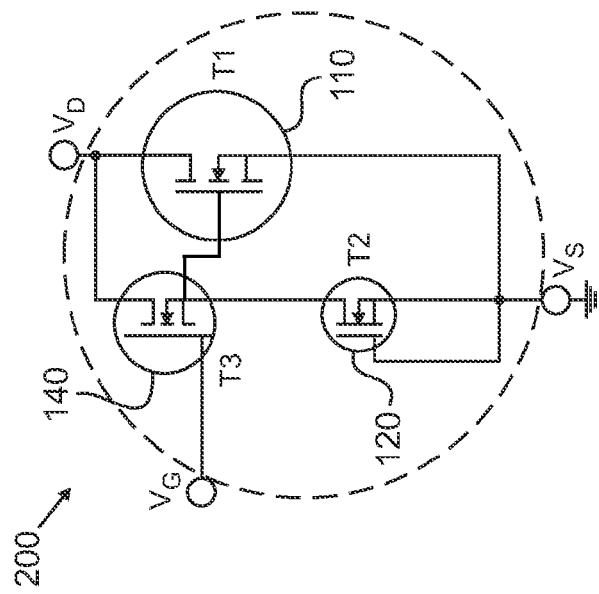
FIG. 4 shows another example of a HFET circuit arrangement 200 constructed in accordance with the principles of the present invention.

FIG. 4 shows another example of a HFET circuit arrangement 200 constructed in accordance with the principles of the present invention. In this example the level shifting diodes 115 are replaced with one or more level shifting transistors such as level shifting transistor 140, which is depicted as an enhancement mode HFET. The drain of the level shifting transistor 140 is connected to the drain of the HFET 110 and the source of the level shifting transistor 140 is connected to the gate of the HFET 110 and the drain of the load HFET 120. One advantage that arises from the use of the level shifting transistor 140 is that a smaller driver current may be employed than is needed when level shifting diodes 130 are used, which, as noted above, may require tens of miliamperes from the driver circuit.

Figure 6:
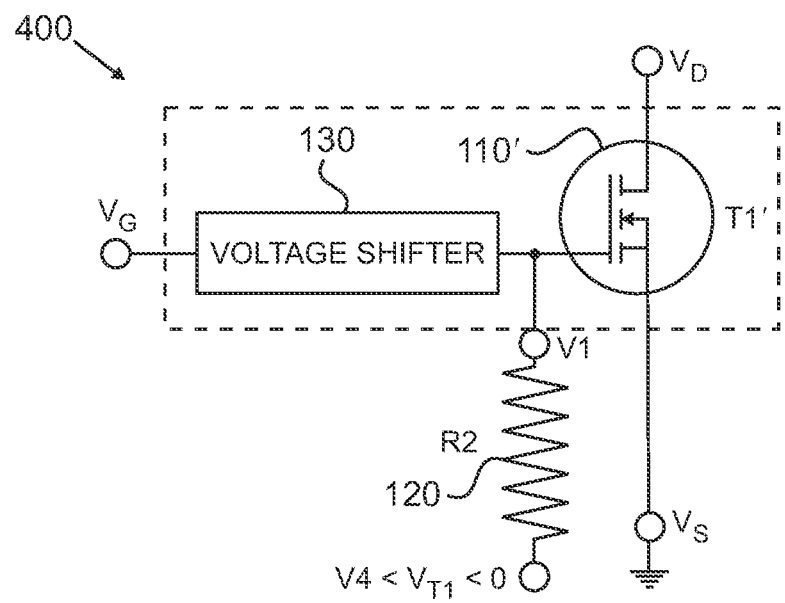
FIG. 6 shows another example of a four terminal HFET arrangement constructed in accordance with the principles of the present invention.

The HFET circuit arrangements shown in FIGS. 1 and 4 are both three terminal devices. Other such arrangements may be four terminal devices. FIG. 5a shows a four terminal HFET arrangement 300 in which the load resistive element 120 is a resistor that is connected to a voltage source V4 instead of the source voltage VS of the HFET 110 as in FIG. 2. By separating the voltage sources VS and V4 the threshold voltage may be adjusted over a larger range. In some embodiments the resistor may be replaced with a depletion mode transistor 120 having its gate shorted to the source, as shown in FIG. 5b. FIG. 6 shows another four terminal HFET arrangement 400 that is similar to the arrangement shown in FIG. 5a, except that the enhancement mode HFET 110 in FIG. 5a is replaced with a depletion mode HFET 110'. In this case a fixed external negative bias V4<$V_{T1}$ can be applied to the load resistive element 120 so that the arrangement 400 can operate as an enhancement mode device. Alternatively, the arrangement can be operated as a depletion mode device for any threshold voltage greater than V4. The use of a voltage V4 allows maximum current flow in the HFET 110'.

Figure 7:
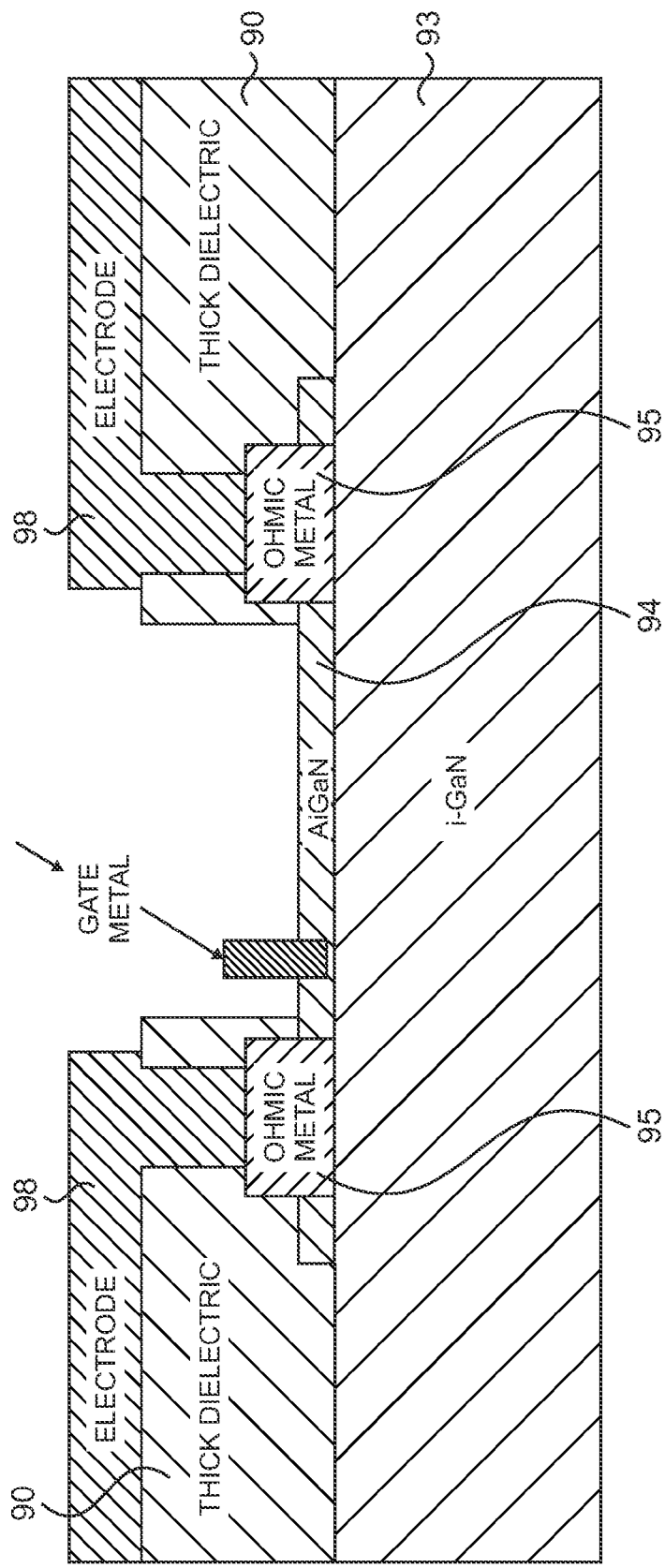
FIG. 7 shows a cross-sectional view of an enhancement mode power HFET.

An enhancement mode power HFET 110 having a low $V_T$ may be realized in a number of different ways, many of which of variants of the HFET shown in FIG. 1. For instance, FIG. 7 shows a device that has a semi-insulating GaN layer (i-GaN) 93 formed on a wafer, followed by an optional AlN layer inter-barrier layer (not shown), followed by an AlGaN layer 94. An optional GaN cap layer may also be grown. Ohmic contact metals 95 are deposited to form the source and drain. There may also be an optional dielectric deposition step to form a source/gate metal bridge. As shown, the dielectric layer is removed from active region (i.e., the region between the source and drain) and the ohmic metal contact region by a dry/wet etching process. A high current power transistor often requires thick electrode metals 98. A gate metal 88 is also formed in the active region.

The gate region of the HFET shown in FIG. 7 may be specially treated for enhancement mode operation. For instance, a $CF_4$ plasma treatment may be employed. The $CF_4$ treatment is usually performed in the gated region by a RIE or an ICP tool using appropriate bias voltages (e.g., in a range of one hundred to a few hundred volts). Such a treatment has two consequences: one is to actively dope the gate region with negative F ions; the other is to partially etch the AlGaN layer to form a recessed gate. Both will facilitate the removal of electrons from the gate region to form an enhancement mode device. However, it will generally be important to not overtreat the gate region to avoid forming a highly resistive region. In some cases the treatment may only need to be mild to produce a barely normally-off device. One drawback to such a structure is that without the use of passivation layers it might suffer from gate lag or current collapse during switching operations. Also, the $CF_4$ treatment can cause damage to the Schottky interface, which leads to a high gate leakage. Also, a device without a passivation layer can make the device difficult to package and might cause arcing for high voltage operations. It is worth mentioning that another option for an enhancement gate is to use p-type materials in the gated region by regrowth or selective etching.

Figure 8:
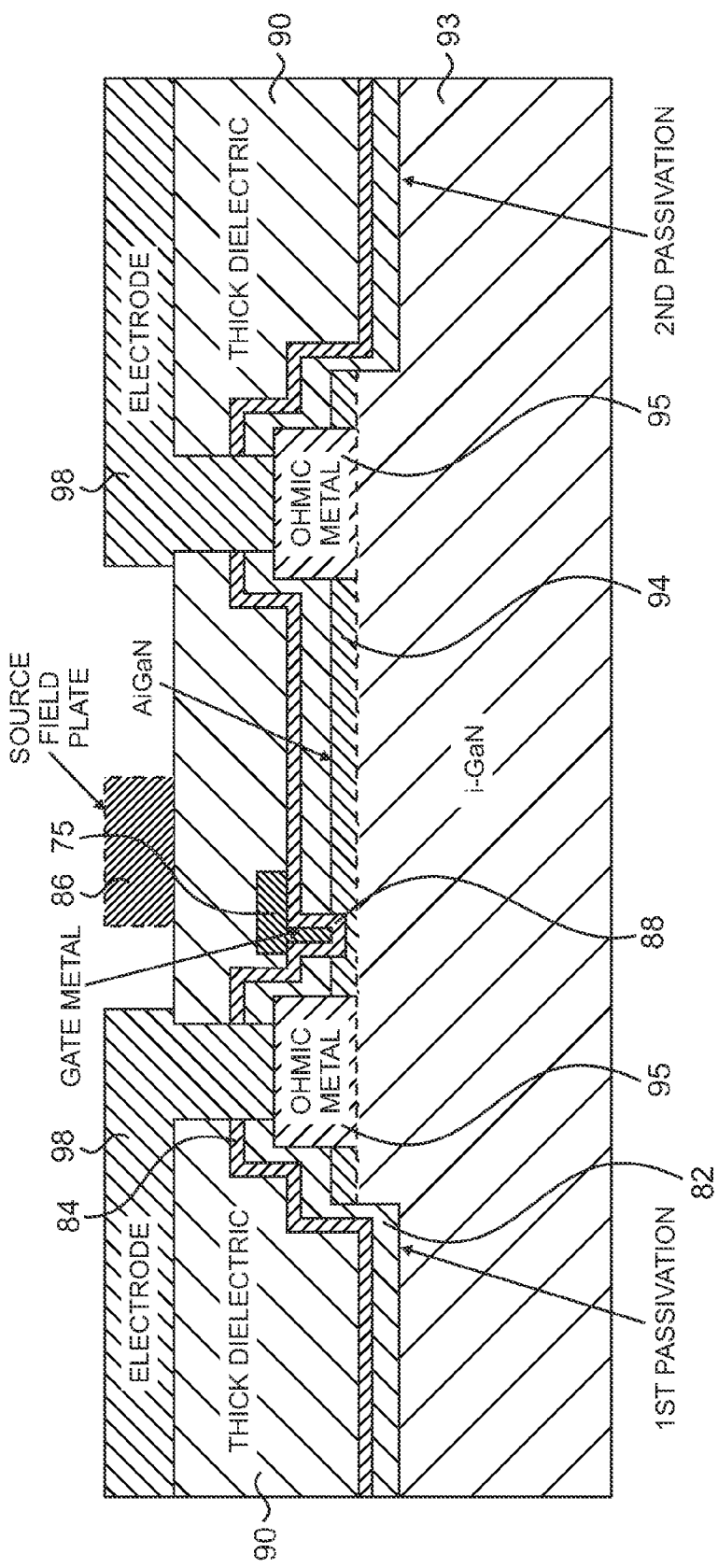
FIG. 8 shows a cross-sectional view of an additional example of an enhancement mode power HFET.

A more sophisticated structure for the enhancement mode power HFET 110 is shown in FIG. 8, which employs passivation layers 82 and gate dielectric 84. Also, an optional gate dielectric 81 is shown for reducing the gate leakage current. The challenges involved in forming this structure include: a) finding a passivation material that causes relatively few surface traps and a low surface leakage current, especially at high voltages; b) finding a gate dielectric material to cut off the gate leakage without shifting the gate threshold voltage to a more negative value; and c) finding a robust and reliable gate dielectric material within the gate operating voltage. The materials used to form the passivation and gate dielectric layers include, by way of example, $HfO_2$, $Si_3N_4$, $SiO_2$, AlN, $Al_2O_3$, etc. In FIG. 8, the gate dielectric 84 and passivation layer 82 are formed separately. Additional thick dielectric layers 90 which are not directly deposited on the semiconductor surface may be formed from $Si_3N_4$ and $SiO_2$ or combination thereof. The use of these dielectrics allows the implementation of multiple field plates, bridging the gate metal and the source metal, and capsulation of the device. For instance, the gate extension outside the treated region forms a gate field plate 75 on top of passivation layer 82. FIG. 8 shows a source field plate 86 that may be employed to lower the electric field at sharp corners.

Figure 9:
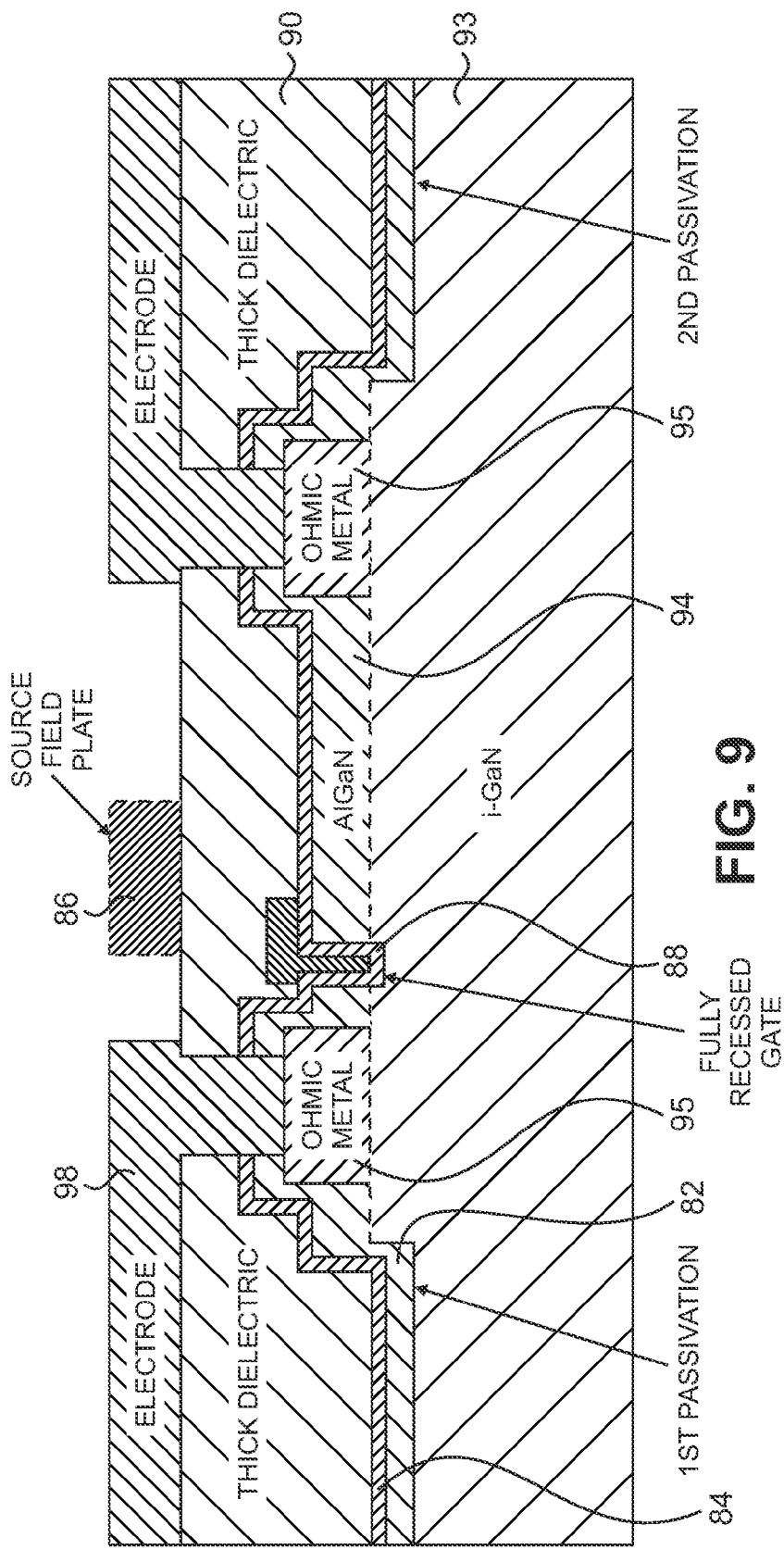
FIG. 9 shows one example of a suitable level shifting transistor that may be used in the arrangement of FIG. 4

One example of a suitable level shifting transistor 140 used in the arrangement of FIG. 4 is shown in FIG. 9. The level shifting transistor 140 is similar to the enhancement mode HFET 110 shown in FIG. 8, except that the HFET shown in FIG. 9 employs a gate 88 that is fully recessed and in which all of the AlGaN removed, thus forming a normally-off device. Depending on the recess etching of the gate, the surface morphology and the dielectrics employed, the threshold voltage of the level shifting transistor 140 may be in the range of +1 to +6V or even higher. Although such a recessed gate will greatly reduce the current capability of the device, this is not an issue for a driver. A higher output current can be controlled by designing a gate with a larger width. The driving current on the gate will be negligible, except for the very small leakage current of the gate. In comparison to the HFET 110 of FIG. 8, which serves as a power transistor, the level shifting transistor 140 can have a large gate-to-drain spacing and a more generous field plate design so that the device can easily block high voltages. It should be noted that more than one level shifting transistor may be employed if a very high threshold voltage is needed.

Figure 10:
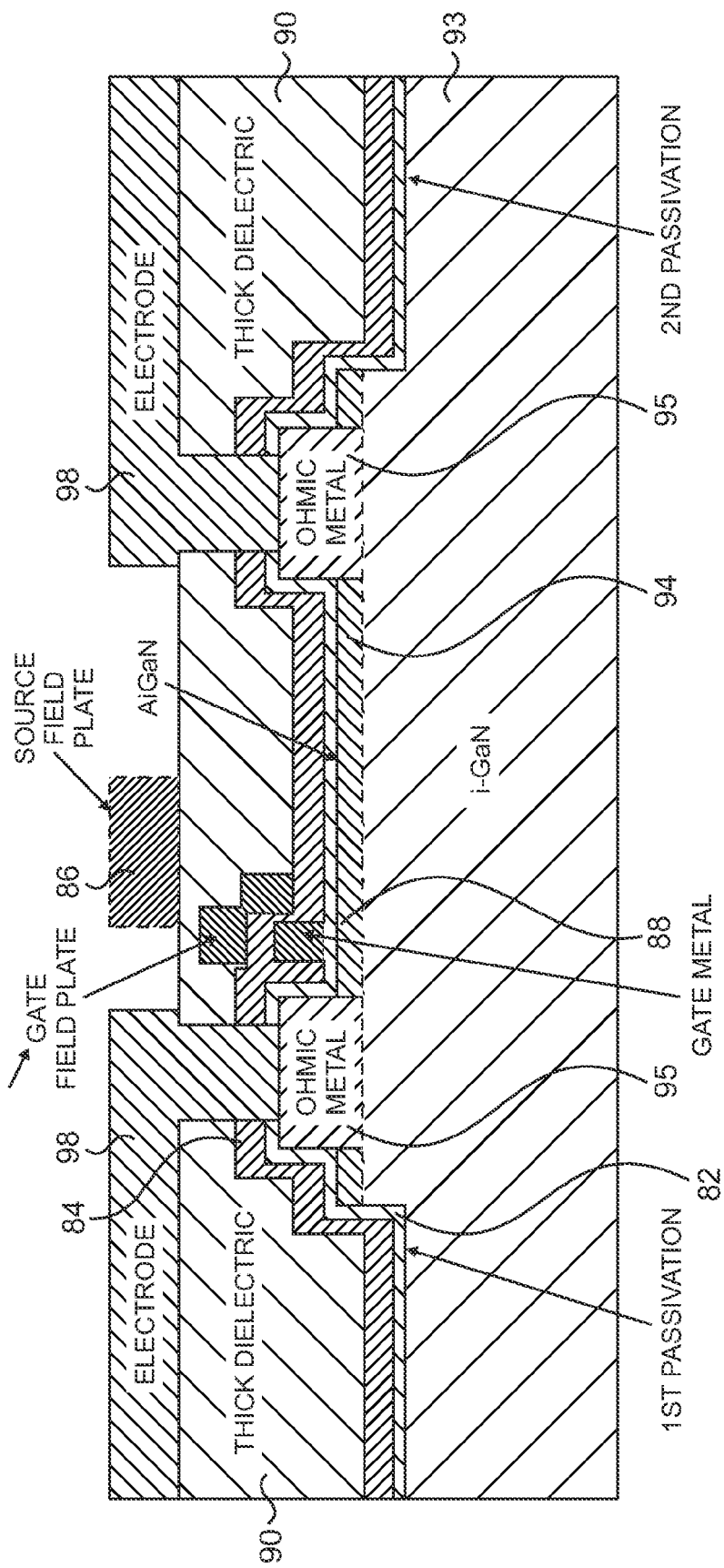
FIG. 10 shows a cross-sectional view of a depletion mode power HFET.

Similar to the enhancement mode power HFET 110, the depletion mode power mode HFET 110' shown in FIG. 6, which has a low $V_T$, may be realized in a number of different ways. An example of such a depletion mode HFET device is shown in FIG. 10. Thus depletion mode HFETs usually have a higher Imax and lower Ron than enhancement mode devices. One difference between the enhancement-mode HFET and the depletion-mode HFET is that the gate region treatment employed during the formation of the enhancement mode HFET is not necessary for the formation of the depletion-mode device.

Figure 11:
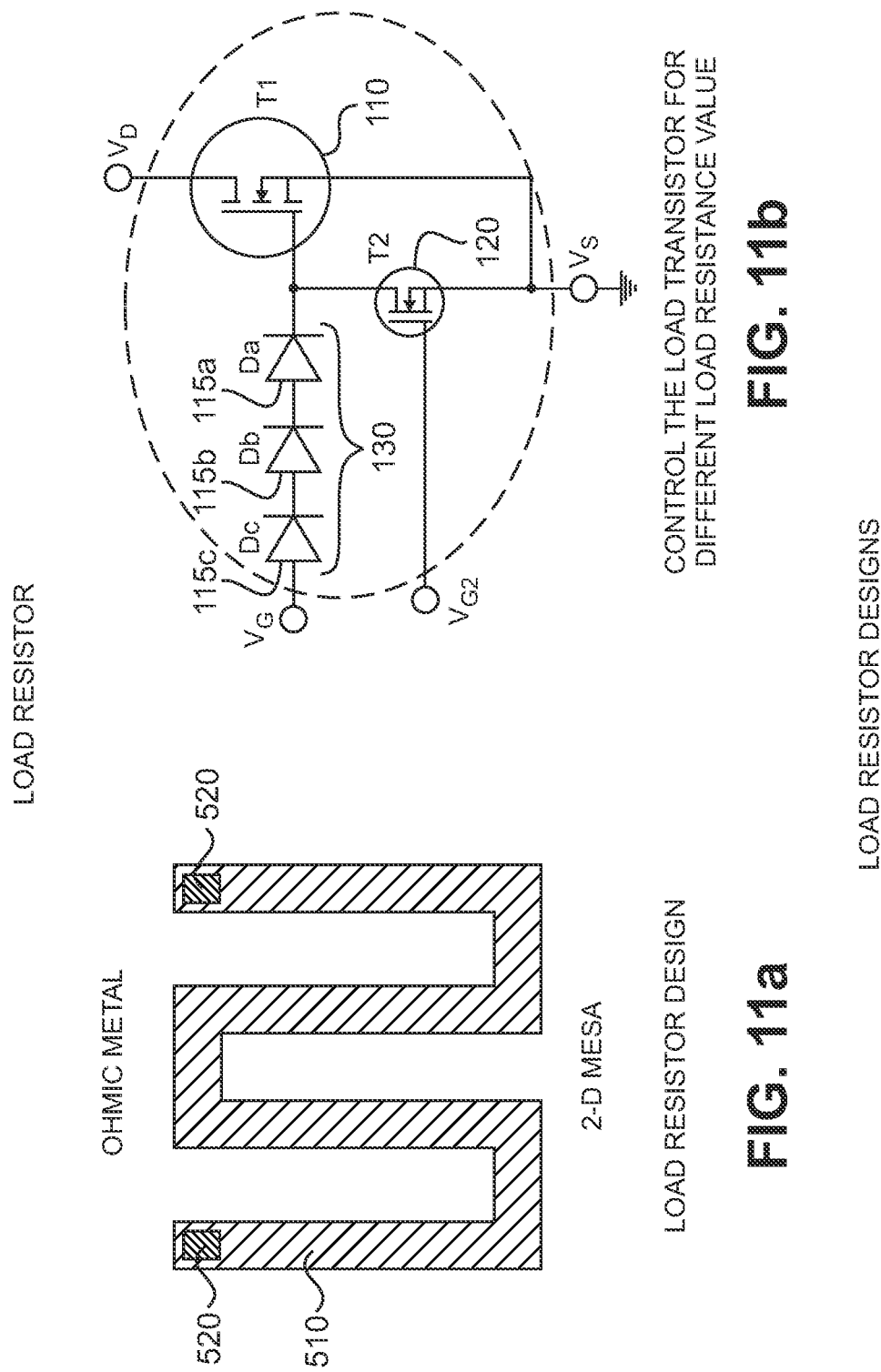

The HFET circuit arrangements described herein may be formed by monolithic integration of the HFET 110 or 110', the voltage shifter 130 and the load resistive element 120. Alternatively, a hybrid arrangement may be formed as well. For instance, if a load resistor is employed, it can be a monolithically integrated resistor or an external resistor. FIG. 11a shows one way in which a resistor may be monolithically integrated with the transistors. In this example, shown in a plan view, one or more long and narrow metallic stripes 510 are formed with ohmic contacts on both ends. The stripes 510 may be straight or nonlinear (e.g., curved, zig-zag, spiral, etc) in whole or in part. In another example the resistive element may be formed from a depletion-mode HFET having a large gate length and a large gate-to-drain spacing. By shorting the gate to the source, it becomes a natural resistor. A resistive element formed from a HFET may be smaller in dimension than the resistor shown in FIG. 11a since the gate introduces extra impedance even when biased at zero. Also, if the resistor value needs to be tuned, the gate of the depletion-mode HFET can be disconnected from the source so that it can be controlled separately by $V_{G2}$. A HFET circuit arrangement 600 constructed in this manner is shown in FIG. 11b.

Figure 12:
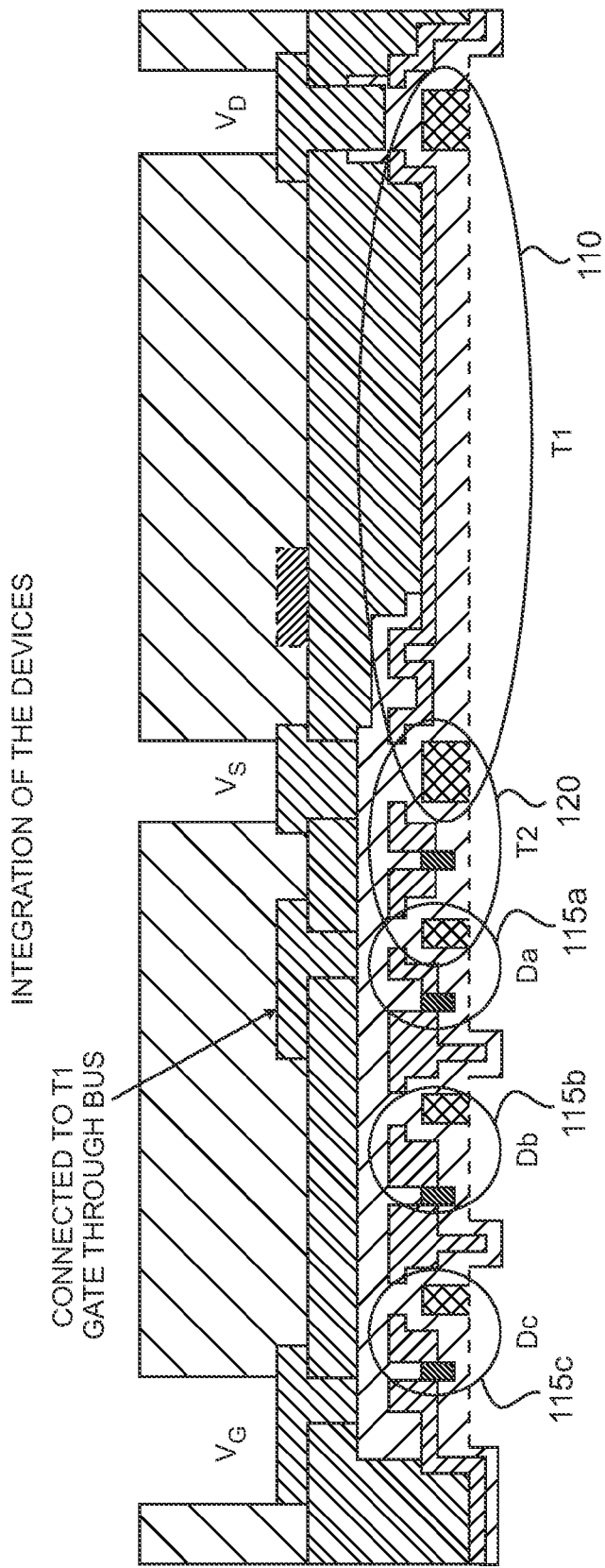
FIG. 12 shows a cross-sectional view though one example of a monolithically integrated implementation of the HFET arrangement shown in FIG. 2.
Figure 14A:
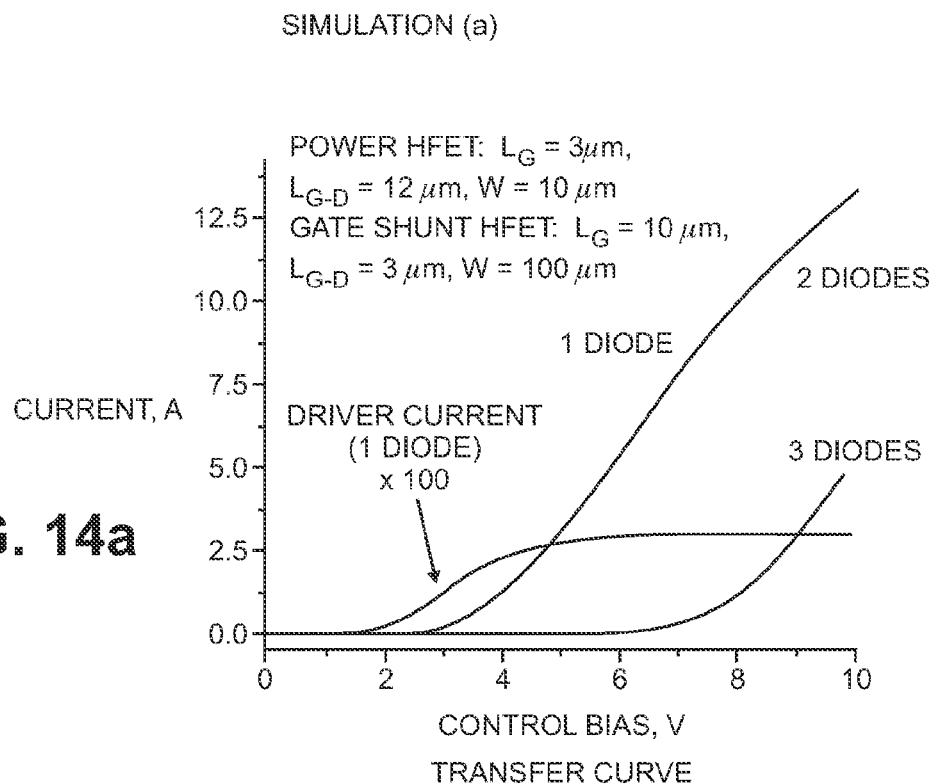
FIGS. 14a-14b and 15a-15b show simulation results for the circuit arrangements shown in FIGS. 2 and 4, respectively.
Figure 14B:
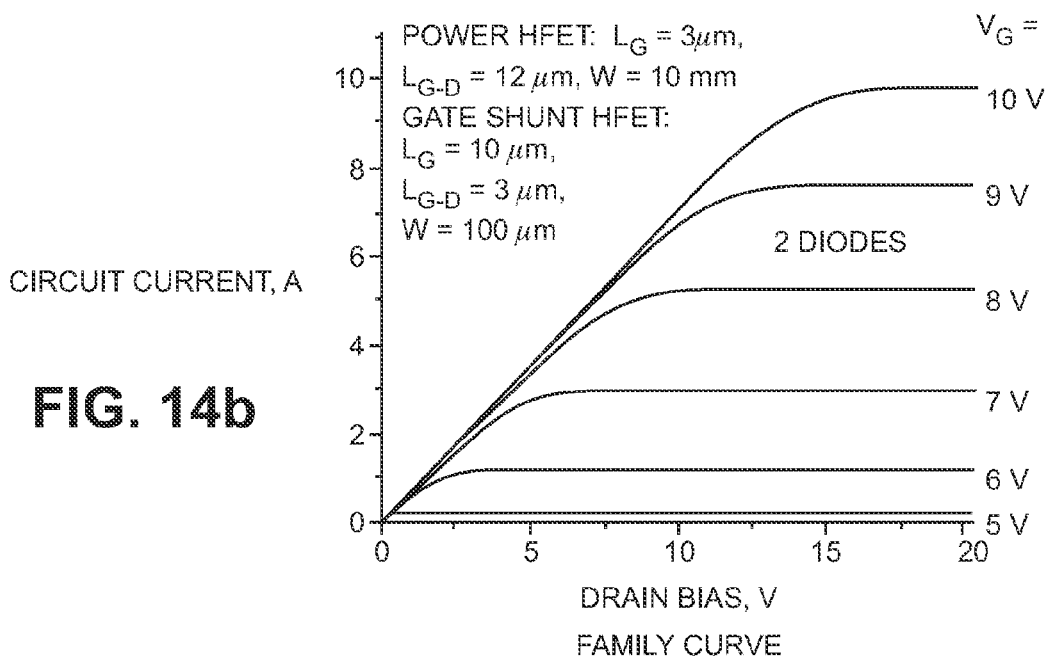

FIG. 12 shows a cross-sectional view though one example of a monolithically integrated implementation of the HFET 100 arrangement shown in FIG. 2. As shown, the HFET 100 arrangement includes level shifting diodes 115a, 115b and 115c, enhancement mode HFET 110 and depletion mode load HFET 120. A plan view of the monolithically integrated HFET 100 is shown in FIG. 13.

One possible processing sequence that may be used to produce the arrangement 100 shown in FIGS. 12 and 13 is as follows. First, an isolation mesa is etched. Alternatively, isolation may achieved by performing an isolation implantation step. Next, the ohmic metal is formed, followed by annealing. An etching step is performed to form the gate recess of the HFET 110 and the gate is treated with a CF4 plasma or a regrowth of p type materials. Additional annealing might be needed to recover from the damage caused to the gate region or, alternatively, to activate the p dopants. The sequence in which the ohmic contact metal step and gate treatment step might be exchanged depending on the processing temperature. Usually the higher temperature processing step is performed first. The first passivation layer is then applied, followed by formation of the HFET 110 gate and the second passivation layer. The opening for the gate vias for HFET 120 is subsequently formed as well as the Schottky anode of diodes 115*a*, 115*b* and 115*c*. Next, the gate of HFET 120 is formed as well as the metal contacts of the Schottky diodes 115*a*, 115*b* and 115*c*. The field plate metal and the third passivation layer are then formed. Finally, a metallization process is performed to form the source and drain electrode and the interconnection metals. Optionally, a fourth passivation layer and an open bonding pad region may be formed, neither of which are shown in FIGS. 12 and 13.

Figure 15A:
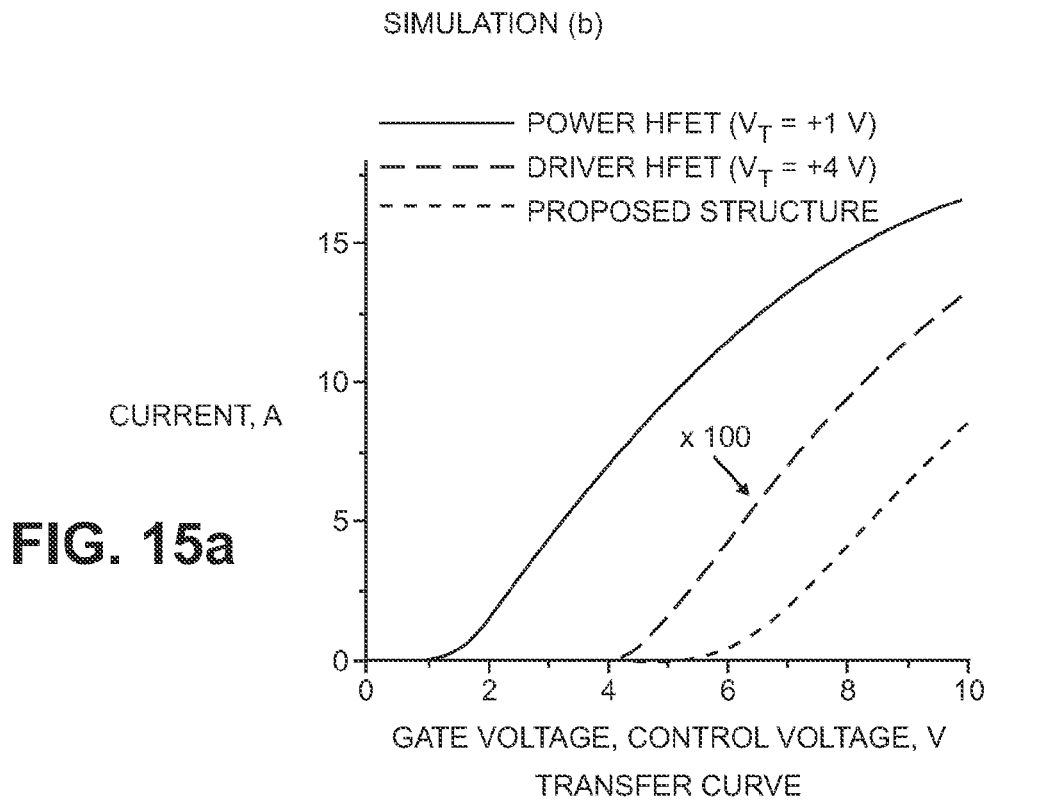
Figure 15B:
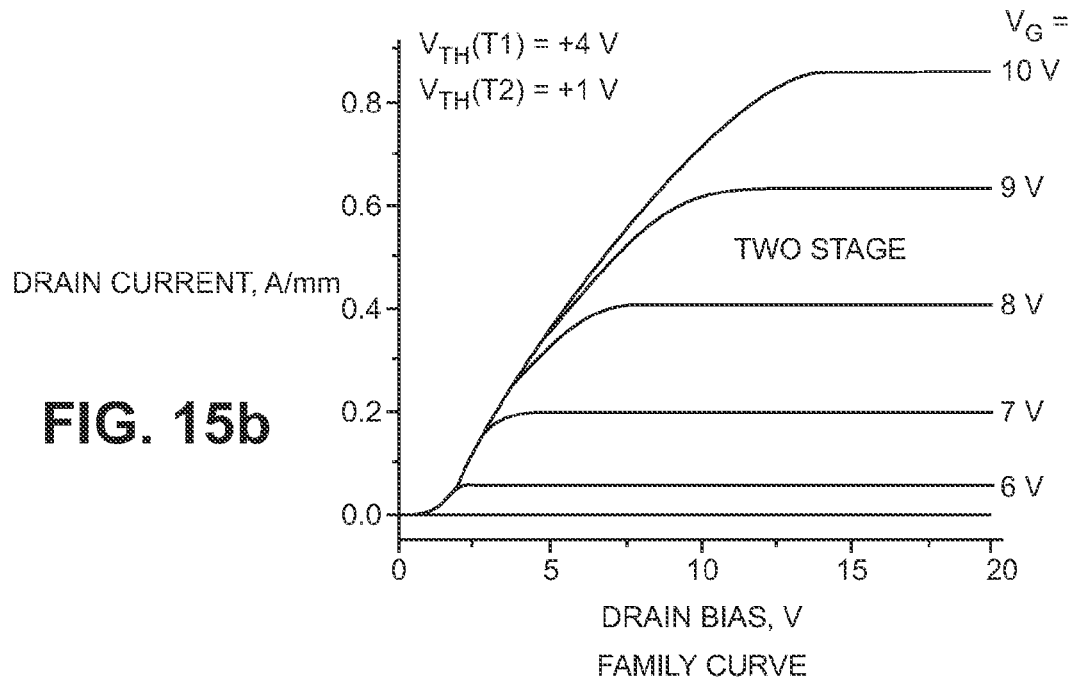

Simulation results for the circuit arrangements shown in FIGS. 2 and 4 are provided in FIGS. 14*a* and 14*b* and FIGS. 15*a* and 15*b*. The parameters used in FIGS. 14*a* and 14*b* include $V_{T1}$=0.5V, $V_{bi}$ of each level shift diode is 1.5V with one to three stages of diodes being simulated. In FIGS. 15*a* and 15*b*, a 4V $V_{T3}$ level shift transistor is used and $V_{T1}$ is chosen to be 1V. The transfer curve clearly shows that the total threshold voltage can be shifted a high positive values. The drain current of the structures are mainly determined by the power transistor in both cases.

Although various embodiments are specifically illustrated and described herein, it will be appreciated that modifications and variations of the present invention are covered by the above teachings and are within the purview of the appended claims without departing from the spirit and intended scope of the invention. For example, while the HFETs have been described as a GaN-based device, the invention more generally encompasses a depletion mode HFET that is formed from any Group III nitride compound semiconductor in which the group III element may be gallium (Ga), aluminum (Al), boron (B) or indium (In).

The invention claimed is:

1. A monolithically integrated enhancement-mode HFET arrangement, comprising:
   a group III nitride enhancement-mode HFET that includes:
   a substrate;
   a first active layer disposed over the substrate;
   a second active layer disposed over the first active layer, wherein the second active layer has a higher bandgap than the first active layer such that a two-dimensional electron gas layer arises between the first active layer and the second active layer;
   a gate that extends into the second active layer; and
   a source and drain disposed over the second active layer;
   a gate bus electrically coupled to the gate of the enhancement-mode HFET;
   a voltage shifter monolithically integrated with the enhancement-mode HFET, said voltage shifter having a first terminal electrically coupled to the gate bus of the enhancement mode HFET;
   a load resistive element monolithically integrated with the enhancement-mode HFET and the voltage shifter, the load resistive element being electrically coupled to the gate bus; and
   wherein the drain of the enhancement-mode HFET serves as an input drain node of the monolithically integrated enhancement-mode HFET, the source of the enhancement-mode HFET serves as an input source node of the monolithically integrated enhancement-mode HFET and a second terminal of the voltage shifter serves as an input gate node of the monolithically integrated enhancement-mode HFET.

2. The monolithically integrated enhancement-mode HFET arrangement of claim 1 further comprising at least one metallization interconnect layer electrically coupling the enhancement-mode HFET, the voltage shifter and the enhancement-mode HFET to the gate bus.

3. The monolithically integrated enhancement-mode HFET of claim 1 wherein the group III nitride includes GaN.

4. The monolithically integrated enhancement-mode HFET of claim 1 wherein the enhancement-mode HFET is a low threshold voltage HFET.

5. The monolithically integrated enhancement-mode HFET of claim 1 wherein the voltage shifter comprises at least one diode.

6. The monolithically integrated enhancement-mode HFET of claim 1 wherein the voltage shifter comprises a plurality of Schottky diodes.

7. The monolithically integrated enhancement-mode HFET of claim 1 wherein the load resistive element comprises a resistor.

8. The monolithically integrated enhancement-mode HFET of claim 1 wherein the load resistive element comprises a transistor.

9. The monolithically integrated enhancement-mode HFET of claim 8 wherein the transistor comprises a depletion mode HFET having its gate shorted to its source.

10. The monolithically integrated enhancement-mode HFET of claim 9 wherein the depletion mode HFET comprises:
    a substrate;
    a first active layer disposed over the substrate;
    a second active layer disposed on the first active layer, the second active layer having a higher bandgap than the first active layer such that a two-dimensional electron gas layer arises between the first active layer and the second active layer;
    a recessed gate that extends through the second active layer; and
    a source, gate and drain contact disposed over the second active layer.

11. The monolithically integrated enhancement-mode HFET of claim 1 wherein the voltage shifter comprises at least one transistor.

12. The monolithically integrated enhancement-mode HFET of claim 11 wherein the at least one transistor comprises a second group III enhancement mode HFET.

13. The monolithically integrated enhancement-mode HFET of claim 12 wherein the second group III enhancement mode HFET has its gate and source shorted to ground.

14. The monolithically integrated enhancement-mode HFET of claim 12 wherein the second group III enhancement mode HFET has a drain connected to the drain of the enhancement mode HFET and a source connected to the gate of the enhancement mode HFET.

15. The monolithically integrated enhancement-mode HFET of claim 1 further comprising a fourth input node, wherein a terminal of the load resistive element serves as the fourth input node.

16. A circuit, comprising:
input drain, source and gate nodes;
a group III nitride enhancement-mode HFET having a source, drain and gate;
a voltage shifter having a first terminal connected to the gate of the enhancement mode HFET at a common junction;
a transistor connected to the common junction;
wherein the drain of the enhancement-mode HFET serves as the input drain node, the source of the enhancement-mode HFET serves as the input source node and a second terminal of the voltage shifter serves as the input gate node; and
wherein the transistor comprises a depletion mode HFET.

17. The circuit of claim 16 wherein the depletion mode HFET is a group III nitride depletion mode HFET.

18. The circuit of claim 17 wherein the group III nitride depletion mode HFET comprises:
a substrate;
a first active layer disposed over the substrate;
a second active layer disposed on the first active layer, the second active layer having a higher bandgap than the first active layer such that a two-dimensional electron gas layer arises between the first active layer and the second active layer;
a recessed gate that extends through the second active layer; and
a source, gate and drain contact disposed over the second active layer.

* * * * *